United States Patent [19]

Ichikawa et al.

[11] Patent Number: 5,500,102

[45] Date of Patent: Mar. 19, 1996

[54] METHOD OF FORMING DEPOSITED SEMICONDUCTOR FILM

[75] Inventors: Takeshi Ichikawa, Tokyo; Hitoshi Shindo, Isehara; Kazuaki Ohmi, Yokohama, all of Japan

[73] Assignee: Canon Kabushiki Kaisha, Tokyo, Japan

[21] Appl. No.: 239,570

[22] Filed: May 9, 1994

[30] Foreign Application Priority Data

May 10, 1993 [JP] Japan ................... 5-131066

[51] Int. Cl.⁶ .................................................. C23C 14/34
[52] U.S. Cl. .............. 204/192.25; 136/258; 204/298.08; 204/298.06; 437/4; 437/101; 437/108; 437/109
[58] Field of Search .............. 204/192.25; 136/258 AM; 437/4, 101, 108–109

[56] References Cited

U.S. PATENT DOCUMENTS

| | | | |
|---|---|---|---|
| 5,194,398 | 3/1993 | Miyachi et al. | 437/108 |
| 5,248,348 | 9/1993 | Miyachi et al. | 136/258 |
| 5,288,658 | 2/1994 | Ishihara | 437/101 |

FOREIGN PATENT DOCUMENTS

| | | | |
|---|---|---|---|
| 52-016990 | 2/1977 | Japan | H01L 31/04 |
| 54-086341 | 7/1979 | Japan | C23B 13/02 |
| 63-050025 | 3/1988 | Japan | H01L 21/31 |
| 3-065013 | 3/1991 | Japan | H02H 3/08 |
| 4-065120 | 3/1992 | Japan | H01L 21/205 |

OTHER PUBLICATIONS

Paul, W. et. al., "Doping, Schottky Barrier And p–n Junction Formation In Amorphous Germanium And Silicon By rf Sputtering," Solid State Communications, vol. 20, pp. 969–972, (1977).

Brodsky, M. H., et. al. "Quantitative analysis of hydrogen in glow discharge amorphous silicon," Applied Physics Letters, vol. 30, No. 11, Jun. 1, 1977, pp. 561–563.

Miller, D. L. et. al., "Some properties of evaporated amorphous silicon made with atomic hydrogen," Journal of Applied Physics, vol. 49, No. 12, Dec. 1978, pp. 6192–6193.

Spear, W. E. et. al., "Substitutional Doping Of Amorphous Silicon," Solid State Communications, vol. 17, pp. 1193–1196, 1975.

Brodsky, M. H. et. al., "Electrical Conduction in evaporated amorphous silicon films," Journal Of Non–Crystalline Solids, vols. 8–10, (1972) pp. 739–744.

Chittick, R. C. et. al., "The Preparation and Properties of Amorphous Silicon," Journal Of The Electrochemical Society, vol. 116, No. 1, pp. 77–81, Jan. 1969.

Turner, D. P. et. al., "The Growth and Properties Of Bias–Sputtered aSi–H" AIP Conference Proceedings pp. 47–51, No. 73 (1981).

Moustakas, T. D., "Studies Of Thin–Film Growth Of Sputtered Hydrogenated Amorphous Silicon," Solar Energy Materials, 8 (1982) pp. 187–204.

Shirai, H. et. al., "Very Stable a–Si:H Prepared by Chemical Annealing," Japanese Journal Of Applied Physics, vol. 30, No. 5B, May, 1991, pp. L881–L884.

Shirai, H. et. al., "A novel preparation technique for preparing hydrogenated amorphous silicon with a more rigid and (List continued on next page.)

Primary Examiner—Aaron Weisstuch
Attorney, Agent, or Firm—Fitzpatrick, Cella, Harper & Scinto

[57] ABSTRACT

A method of forming a deposited semiconductor film, comprising the steps of using a target containing semiconductor material to be deposited, an inert gas containing hydrogen at 0.1 at % or more and sputtering energy of a high frequency of 50 MHz or higher, and employing a reactive sputtering method, wherein a sputter deposition process, in which a semiconductor film, the main component of which is the material to be deposited and the thickness of which is 10 nm or thinner, is formed on a substrate, and an irradiation process, in which a surface of the deposited film is irradiated with plasma in an atmosphere containing hydrogen, are alternately repeated, and a DC or high frequency bias voltage is applied to said target and/or said substrate.

4 Claims, 4 Drawing Sheets

OTHER PUBLICATIONS stable Si network," Applied Physics Letters, vol. 59, No. 9, Aug. 26, 1991, pp. 1096–1098.

Iizima, S. et. al., "Preparation and characterization of reactively-sputtered amorphous Si:H films," *Japanese Journal of Applied Physics, vol. 19 (1980 Suppl. 19–1, pp. 521–526).*

Logan, J. S., et. al. "The rf glow discharge sputtering model," Journal of Vaccum Science & Technology, vol. 14, No. 1, Jan./Feb. 1977, pp. 92–97.

Ohmi, T. et. al., "Formation of device-grade epitaxial silicon films at extremely low temperatures by low-energy bias sputtering," J. Applied Physics, vol. 66, (10) 1989 pp. 4756–4766.

METHOD OF FORMING DEPOSITED SEMICONDUCTOR FILM

BACKGROUND OF THE INVENTION

1. Field of the Invention

The present invention relates to a method of forming a deposited film, and more particularly to a method of forming a deposited film for use in the manufacture of a device containing amorphous silicon (hereinafter called "a-Si") as a component thereof.

2. Related Art

Hydrogenated amorphous silicon (a-Si:H) semiconductors have been widely used in electronic devices, such as electrophotographic photosensitive members, image pickup tubes, solid-state image sensing devices, TFTs for display, solar cells, and so forth.

Hitherto, a variety of methods for depositing an amorphous semiconductor of a type containing elements in Group IV of the Periodic Table, such as a-Si, a-SiGe, a-SiC, a-SiN, or a-SiO, have been suggested as exemplified by a vacuum evaporation method (see, for example, Journal of Non-Crystalline Solids, Vols. 8 to 10, p. 739, 1972), a sputtering method, or any of various CVD methods, such as a plasma CVD method and a photo CVD method.

Among the methods, a plasma CVD method using a semiconductor precursor gas, such as $SiH_4$, to form a film on a substrate by RF glow discharge decomposition employing a frequency of 13.56 MHz has been widely used because excellent quality a-Si can be deposited.

The plasma CVD method developed by R. Chittick et al. (Journal of Electrochemical Society, Vol. 166, p. 77, 1969), and W. E. Spear et al. (see Solid State Communications, Vol. 17, p. 1193, 1975) succeeded in providing pn-control of the electric conduction occurring due to impurities in the amorphous semiconductor, attracting great attention. Thus, a multiplicity of applications have been attempted, such as solar cells (see Japanese Patent Laid-Open No. 52-16990 and so forth) and electrophotographic photosensitive members (see Japanese Patent Laid-Open No. 54-86341 and so forth). The foregoing methods have been widely developed, resulting in a variety of modifications as exemplified by a method wherein a semiconductor precursor gas is diluted with hydrogen or Ar, a method in which a frequency higher than RF is used, and a method in which a magnetic field is applied in order to create electron cyclotron resonance.

Superior characteristics (photoconductivity and controllability of the electric conductivity with impurities and so forth) to that obtainable from pure a-Si can be obtained because a-Si prepared by the plasma CVD method contains several to tens of % hydrogen (see Applied Physics Letters, Vol. 30, No. 11, p. 561, 1977) and 10 to 20% hydrogen is normally contained in the deposited film. A variety of methods have been developed in which hydrogen is simultaneously supplied during formation of the film by other methods.

For example, supply of hydrogen during a vacuum evaporation method enables excellent a-Si to be obtained (Journal of Applied Physics, Vol. 49, No. 12, p. 6192, 1978).

An attempt has been made to perform a sputtering method using Ar plasma and a semiconductor target made of Si or SiGe in such a manner that hydrogen gas is mixed with Ar gas serving as discharge gas, and a target is caused to react with an element to be deposited with the target material sputtered by high-frequency plasma of 13.56 MHz, to deposit an amorphous film on an oppositely facing substrate, i.e. reactive sputtering (see, for example, Solid State Communications, Vol. 20, p. 969, 1976). It has been found that the foregoing method deposits an excellent quality a-Si:H film with a very low number of dangling bonds.

The sputtering method has an advantage that semiconductor precursor gas, the cost of which cannot be reduced and which is dangerous and cannot be preserved for a long time, is not required. Therefore, its peripheral apparatuses, such as a large cost and large scale toxin-removing apparatus, gas-leakage alarm system and cylinder cabinet, can be simplified considerably, thereby reducing the cost.

Improvement in the foregoing method such that formation of an a-Si film by a so-called bias sputtering method comprising the step of applying a bias to a substrate has been investigated as disclosed in AIP conference Proceedings, Vol. 73, p. 47 (1981) and Solar Energy Materials, Vol. 8, p. 187 (1982) and the like.

As disclosed in Japanese Patent Laid-Open No. 4-65120 or Japanese Journal of Applied Physics, Vol. 30, No. 5B, p. 1881 (1991) or Applied Physics Letters, Vol. 59, No. 9, p. 1096 (1991), some methods have been suggested in which formation of a very thin deposited film by the plasma CVD method followed by irradiation of the deposited film by plasma without formation of the deposited film are alternately performed.

However, the conventional methods have some problems. The high frequency plasma CVD method using $SiH_4$ gas which has been usually used to form a-Si deposits satisfactory a-Si:H.

However, the conventional plasma CVD method using the reactive gas, such as $SiH_4$, necessitates a large cost discharged gas toxin-removal apparatus, gas leakage prevention facility and a gas leakage alarm system. Moreover, high-purity semiconductor gas, the cost of which cannot be reduced and which cannot be preserved for a long time, is required. In addition, the efficiency of the gas usage is very low, for example, about 10% and the film formation rate is unsatisfactory. Therefore, cost reduction cannot be realized satisfactorily.

If excellent quality is intended in the formed film, a low deposition rate is generally required. Thus, it has been difficult to realize simultaneously high deposition rate, excellent film quality, and a large area.

Moreover, a large quantity of the a-Si film adheres to surfaces other than the substrate, such as the inner wall of the film forming chamber and the substrate holder when the a-Si film is formed, causing the a-Si film to be gradually separated, thereby deteriorating the characteristics of the device. In order to prevent this, the a-Si film allowed to adhere to the inner surface of the chamber must be removed periodically. The removing operation must be performed frequently, causing the availability of the film forming apparatus to be lowered.

On the other hand, the reactive sputtering method in which hydrogen is mixed with discharge gas composed of Ar or the like and which uses a high-frequency plasma of about 13.56 MHz does not use large cost and dangerous semiconductor gas. Therefore, the toxin-removing apparatus and the gas leakage alarm system and so forth can be omitted from the structure or can be decreased. Furthermore, the necessity of using the large cost gas can be eliminated, as a result of which great cost reduction can be provided. Moreover, adhesion of films to the inner surface of the film forming chamber can be relatively reduced, and, therefore, maintenance of the chamber can easily be performed.

Although the foregoing advantages can be obtained, the a-Si film formed by the conventional reactive sputtering method involves the following disadvantages. When Ar is mixed with the film, the film is damaged by Ar$^+$ ion bombardment, and the film is formed in a columnar structure so that a uniform and precise film cannot easily be formed. Therefore, the a-Si film is inferior to that formed by the plasma CVD method in that the spin density is relatively high, electricity conductivity ($\sigma_p$) under light irradiation is low, carrier migration characteristics are low, efficiency of doping impurities is low, the deposited films have a columnar non-uniform structure in the direction in which the film grows, and several percent of Ar gas is incorporated in the film. Thus, use of the a-Si film of the foregoing type in a device encounters these problems.

The difference between the characteristics of the a-Si film formed by the reactive sputtering method and those of the a-Si film formed by the plasma CVD method have been reported in a multiplicity of disclosures, for example, Japanese Journal of Applied Physics, Vol. 19, Supplement 19-1, p. 521 (1980).

Although the cause of the foregoing problems has not been clarified yet, it may be considered that they are due to the following causes. First, the deposited film is damaged by ions emitted from the plasma which bombards the surface of the substrate, on which the film is growing and which is placed to face the target.

The sputtering process generally uses a discharge plasma of inert gas of, for example Ar, having a relatively large atomic weight in order to improve the sputtering yield of the target. Among DC discharge, AC discharge, and high-frequency discharge for generating the plasma, it is preferable that high-frequency discharge be employed to form a high-resistance material, such as a-Si. Although ions, such as Ar$^+$ ions, in the high-frequency plasma are accelerated due to the spontaneous bias or a target bias applied externally, colliding with the target to cause atoms in the target to be ejected forcibly, they travel as well to the surface of the growing film. As a result, the deposited film is damaged.

This is due to the potential difference between the plasma and the surface of the growing film, that is, the so-called sheath voltage. The potential difference accelerates the positive ions, such as Ar$^+$ ions, in the direction of the substrate, causing the deposited film on the substrate to be damaged.

A method of preventing the damage by controlling the substrate bias has been known. As disclosed in, for example, Journal of Vacuum Science and Technology, Vol. 14, p. 92 (1977) or AIP Conference Proceedings, Vol. 73, p. 47 (1981) or Solar Energy Materials, Vol. 8 p. 187 (1982), attempts have been made to apply a bias voltage to the substrate to control the energy of Ar$^+$ ions incident from the plasma to the surface of the growing film.

For example, the characteristics of an a-Si:H film deposited on a substrate by using, for example, a polycrystal Si target and a RF discharge (13.56 MHz) using Ar gas containing hydrogen, are affected by the substrate bias. For example, hydrogen in a film deposited by applying a positive substrate bias forms SiH bonds characterized by an infrared absorption peak near 2000 cm$^{-1}$. Although films of a type formed by a GD method usually exhibit excellent characteristics, such as a high $\sigma_p$, the sputtering method cannot always cause the film to have excellent characteristics. There are sometimes formed non-uniform films having unsatisfactory characteristics including a columnar structure.

It has been reported that, if the substrate bias is negative or floating so as to apply a negative induced bias, the hydrogen bonds in the film are brought into a state where bonds, such as SiH$_2$ and (SiH$_2$)$_n$, characterized by an infrared absorption peak near 2100 cm$^{-1}$, are increased and ion damage cannot be prevented, so characteristics may deteriorate. On the other hand, the columnar structure cannot easily be formed and therefore the uniformity of the film cannot always deteriorate.

Another problem is that Ar atoms can easily be captured by the film because Ar$^+$ ions are injected into the film. The injection of the Ar$^+$ ions into the deposited film raised the concentration of Ar atoms received by the film, causing an adverse effect to arise. At least a portion of the effect of the substrate bias is due to the action of the Ar$^+$ ions incident upon the surface of the growing film during the deposition of the film. Another cause may be electrons made incident upon the substrate during deposition. The mechanism has not been clarified yet, and control of the quality of the film has not been obtained.

Another reason is that the ion energy distribution in the plasma is very wide. The wide distribution is caused by acceleration of Ar$^+$ ions and so forth in the plasma due to the high-frequency AC field. Since Ar$^+$ ions and Ne$^+$ ions only narrowly follow the changes in the electric field at a high frequency of about 13.56 MHz, acceleration due to it undesirably takes place. As a result, ions having considerably high initial speeds are formed. Therefore, even if the sheath voltage is, as the DC component, 0 V, high-energy components of ions reach the surface of the deposited film. As a result, it is difficult to completely prevent damage of the deposited film caused by ions by controlling the substrate bias.

There also is a problem due to the migration characteristics of Si atoms on the surface during the film deposition. When a-Si is deposited by the reactive sputtering method using inert gas and hydrogen gas, a major portion of Si sputtered from the target which travels to the surface of the substrate is Si atoms, ions such as Si$^+$ ions, radicals such as SiH, and their ions. The foregoing substances generally have high chemical reactivity as compared with SiH$_3$ which is a precursor of a reaction in the RF plasma CVD method using SiH$_4$. Therefore, if the foregoing active substances exhibiting excellent reactivity reach the surface of the substrate having relatively low temperature, the active substances immediately react substantially as they are. Film deposition proceeds although the structure relaxation process, such as surface transference during the film deposition, has not been completed. As a result, the deposited film is formed into a structure having a multiplicity of structural defects.

The foregoing problem is not critical with metal, such as Al, Cu, Ti or the like, because the bonding orienting force is weak and changes in the structure cannot easily appear in the characteristics. However, it is a very important factor when a film of semiconductor material, such as a-Si, the covalent characteristics of which are strong, the directionality of the bonds of which is clear and the structure sensitivity of which affects the characteristics, is formed. In particular, a-Si is, among amorphous materials, a semiconductor, the electricity conductivity of which can be pn-controlled by means of impurities, and whose characteristics have structural sensitivity in proportion to the quality of the film. Therefore, influence of the deterioration in the surface migration characteristics of Si atoms and H atoms appears as well as the influence of the ion damage, causing $\sigma_p$ to be deteriorated, the doping efficiency in pn-control of the electricity conductivity by doping impurities to be lowered, and the uniformity of the film to be worsened. That is, it is important for a semiconductor material, such as a-Si or a-Si alloy, to enhance the surface migration characteristics of deposited atoms while preventing ion damage of the deposited film.

Therefore, in a case where an excellent a-Si film is deposited by the sputtering method, it is effective to enhance the surface migration characteristics of the reactive precursor on the surface on which the film is growing by any method which promotes structure relaxation in the deposition process.

In the conventional plasma CVD method and the reactive sputtering method, the foregoing requirement has been achieved to a certain degree because the surface, on which the film is growing, is deactivated by hydrogen. Although it can obtain deactivation of the surface by means of hydrogen, the considerably high reactivity of the reactive substances, which reach the surface, causes etching to take place. As a result, the surface can be roughened. Moreover, hydrogen is excessively incorporated in the film, resulting in a structure, such as $SiH_2$ bonds, which worsens the quality of the film, and the precision of the film formation deteriorates. Therefore, simple supply of hydrogen in a large quantity cannot meet the requirement. Although control of the quantity of hydrogen in the reactive sputtering method can be accomplished by employing control of the partial pressure of hydrogen gas or the like, it has been difficult to obtain an excellent a-Si film.

There is a possibility that the surface migration characteristic of Si atoms can be enhanced by raising the temperature of the substrate. However, the foregoing method is caught in the dilemma that excessive increase of the substrate temperature (about 350° C. or higher) causes H atoms adsorbed on the surface to enhance their surface migration characteristics to start separation therefrom and consequently the surface characteristics of Si atoms deteriorate. If the temperature of the substrate is too high, the concentration of hydrogen in the film is lowered, causing the amount of dangling bonds to be increased. Therefore, the characteristics of the film deteriorate. As a result, the foregoing method has a limitation.

An attempt has been made to form a precise structure by bombarding the surface of the growing film by ions in the plasma. If the ion irradiation is performed with a negative substrate bias during the film deposition, the columnar structure which is frequently formed in the sputtering method is not formed and the quality of the film can be improved (Solar Energy Materials, Vol. 8, p. 187, 1982). However, the quality of the film sometimes deteriorates by the applied bias, and it cannot easily be controlled. One reason is that the film is damaged by ions.

Metal deposition methods have been disclosed in, for example, Japanese Patent Publication No. 3-65013, each of which comprises the step of lowering the frequency of a high-frequency bias applied to a substrate to widen the ion energy distribution to prevent formation of projections and pits in the surface of the deposited film. According to the disclosure, plasma, the frequency of which is 5 kHz to 1 MHz, is employed to apply ions, the energy of which is distributed widely, to the substrate to enhance the surface migration characteristics of atoms in the formed film and flatten the deposited film. Although flattening of the surface of the deposited metal film is discussed in the foregoing disclosure, a similar effect, limited to flattening, can, of course, be expected qualitatively in the case of Si. However, the thus-deposited flat a-Si film has no semiconductor characteristics, such as pn-control of the electrical conductivity and the photoconductivity, which are important for applications. This is because the characteristics of a semiconductor material used to form a film, such as Si, have intense structural sensitivity and can easily be affected by the ion damage.

In the conventional method, such as the GD method, the quantity of hydrogen contained in an excellent a-Si film is not less than tens of %. A film of the foregoing type has disadvantageous characteristics, such as deterioration in the film quality due to light, which is caused by weak Si-Si bonds generated due to containing hydrogen. The conventional method inevitably increases the amount of dangling bonds if the concentration of hydrogen is forcibly lowered by, for example, raising the temperature of the substrate. In this case the quality of the film deteriorates.

For preventing the foregoing problem, a method has been disclosed in Applied Physics Letters, Vol. 59, No. 9, p. 1096 (1991) in which formation of a deposited film and irradiation of the film with a hydrogen plasma are alternately repeated. The foregoing method exhibits an advantage in that the dependency of the concentration of hydrogen in the film on the temperature of the substrate can be reduced. The quality of the obtained film does not deteriorate even if the concentration of hydrogen is lowered.

However, the necessity of switching the discharge gas raises a limitation on the speed of switching from the film deposition to irradiation of hydrogen plasma. Therefore, a time during which the gas flow rate and the plasma conditions cannot be controlled is generated between two film deposition steps interposing a hydrogen irradiation step. As a result, the stability of the film deposition sometimes deteriorates. If a certain level of discharge electrical power is supplied at the usual discharge frequency of about 13.56 MHz, the quality of the film growing on the surface sometimes deteriorates due to ion damage.

SUMMARY OF THE INVENTION

Accordingly, an object of the present invention is to provide a method of safely depositing an excellent amorphous semiconductor film containing hydrogen at a low concentration with a low cost and with excellent reproducibility in such a manner that the advantages of the conventional deposition method of forming an amorphous semiconductor are maintained and the disadvantages are overcome.

Another object of the present invention is to provide a method of forming a deposited film in which plasma irradiation is performed in an atmosphere containing hydrogen atoms.

Another object of the present invention is to provide a method of forming a deposited film in which formation of the deposited film and irradiation of the deposited film with plasma are alternately performed.

Other and further objects, features, and advantages of the invention will be appear more fully from the following description.

DESCRIPTION OF THE PREFERRED EMBODIMENTS

A method of forming a deposited film according to the present invention comprises the steps of using a target containing materials to be deposited, inert gas containing 0.1 at % or more hydrogen and high frequency electrical energy of 50 MHz or higher, and employing a reactive sputtering method, wherein a deposition process, in which a deposited film, the main component of which is the material to be deposited and the thickness of which is 10 nm or thinner, is formed on a substrate, and an irradiation process, in which a surface of the deposited film is irradiated with plasma in an atmosphere containing hydrogen, are alternately repeated.

According to the present invention, the deposition process and the plasma irradiation process are repeated alternately so that an excellent amorphous film is formed at a low cost with satisfactory reproducibility.

It is preferable that the switchover between the deposition process and the irradiation process be performed by changing the target bias. The foregoing switchover method eliminates the necessity of switching the gas and changing the pressure, which have been problems experienced with the conventional technology, thus resulting in an excellent deposited film being stably formed.

The method of forming a deposited film according to the present invention forms an excellent amorphous deposited film, such as a hydrogenated a-Si film, containing inert gas, such as Ar, at a very low concentration therein without using expensive and dangerous semiconductor precursor gas. In comparison to hydrogenated a-Si deposited by the reactive sputtering method using a frequency of about 13.56 MHz, the foregoing method enables an a-Si film to be formed which contains a lower number of $SiH_2$ bonds, with a lower number of Ar atoms contained in the film, which has a uniform film structure not containing a columnar structure, which exhibits an excellent efficiency of doping impurities for the purpose of pn-controlling the electrical conductivity and which has high electrical conductivity $\sigma_p$ under light irradiation.

Figure 4:
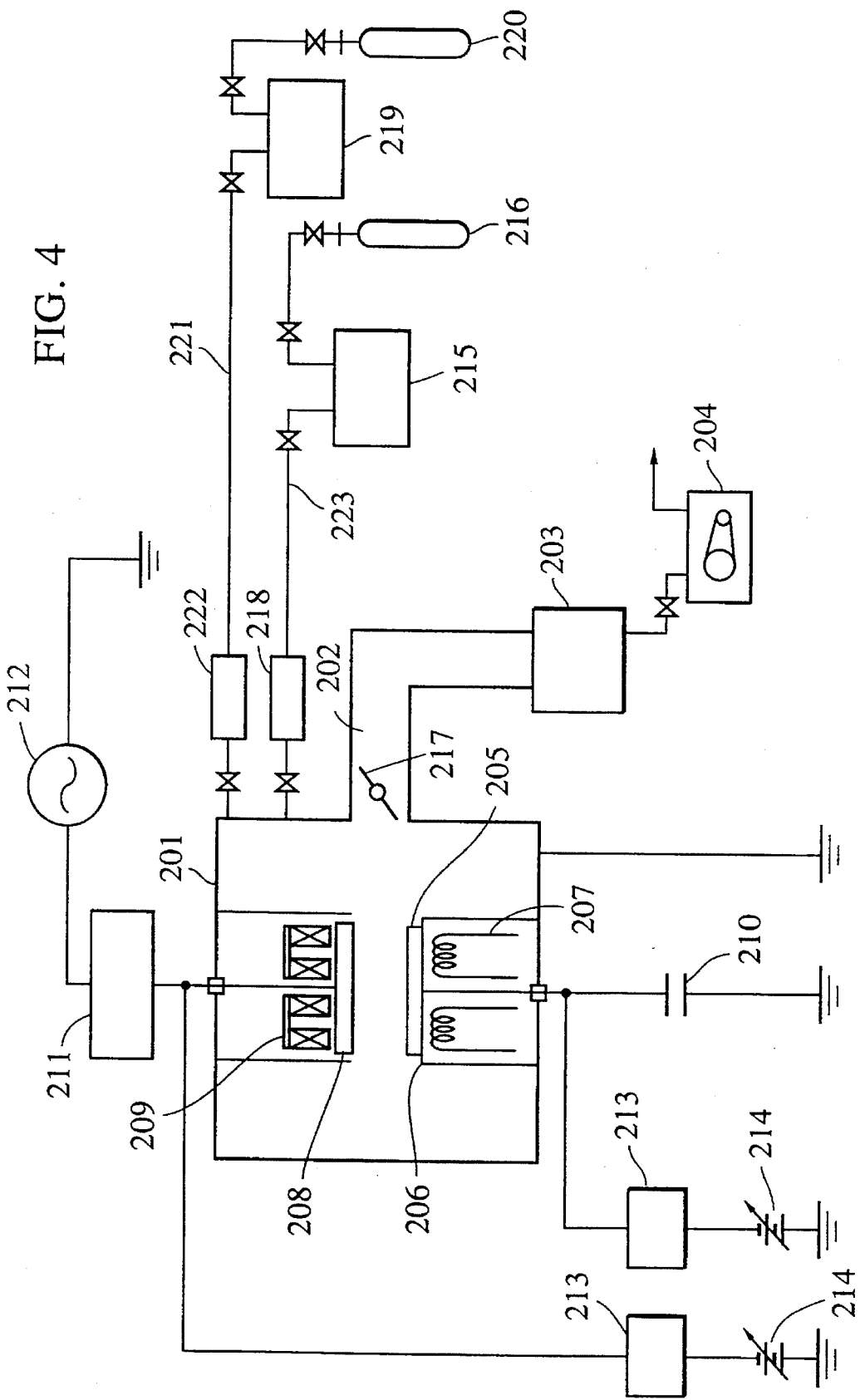
FIG. 4 is a view which illustrates an example of a high-frequency sputtering apparatus used in the present invention.

The outline of the present invention will now be described. Although it is not an object of the present invention to be limited to a specific example of the apparatus, it is necessary to place the target, the main component of which is the material to be deposited, and a substrate, on which a-Si is deposited, in a vacuum chamber because a sputtering method is employed. Although the arrangement is not required to be the parallel, flat plate configuration, which is usually employed in the conventional sputtering method, an apparatus as shown in FIG. 4 may be employed.

The chamber is exhausted to about $10^{-5}$ Torr or lower, preferably $10^{-7}$ Torr or lower in a state where gas is not allowed to flow. Then, Ar gas, together with hydrogen gas, is introduced into the chamber. Ar and hydrogen may, of course, be introduced into the chamber through individual passages before they are mixed with each other in the chamber. The ratio of hydrogen with respect to Ar is required to be 0.1 at % or higher. If hydrogen is not contained in the chamber, the photoelectric characteristics of a-Si are insufficient to be applied to usual structures, such as an image sensor and a solar cell.

The target is made of the material, such as Si, to be deposited, and it is exposed to plasma of inert gas, such as Ar. The plasma can be generated by applying high frequency waves to the target or the target holder. The method of generating the plasma is not necessarily required to be the capacitive coupling method. For example, an inductive coupling method may be employed in which a coil is used and high-frequency waves are applied to the coil. In this case, the target must be brought closer to the plasma. When the film is deposited, ions generated in the plasma are accelerated by the spontaneous bias of the target or a target bias is applied from the outside through a low-frequency transmissive filter so that ions collide with the target. Thus, the material of the target is sputtered. The target bias method has an advantage in that it can be controlled individually by the electric power source for supplying the high frequency waves because the target bias is supplied from the outside. In particular, the deposition rate is raised significantly. By reducing the bias, the film deposition rate can be made to be about zero without direct changes in the plasma.

The material sputtered from the target with ions supplied from the plasma travels to the surface of the substrate placed in the cheer so that the material is deposited on the substrate. When the material is deposited, a DC or high-frequency bias is applied to the substrate to optimally control the energy of the ions incident on the surface of the deposition portion. At this time, at least a portion of the hydrogen mixed with the discharge gas is incorporated in the deposited film. The material travelling to the substrate is made amorphous as deposited by selecting the crystalline characteristics, the temperature of the materials, the bias of the substrate, the atmospheric gas and the conditions of the surface of the substrate and so forth.

The most critical factor for the present invention is to alternately repeat the step in which a film having a thickness of 10 nm or less is sputter deposited and the step in which no film deposition is performed and only the plasma irradiation is performed. The switching between the film deposition step and the step in which only the plasma irradiation is performed can be controlled most simply and easily by switching the target bias.

With the deposition conditions employed in usual sputtering operations, the film can be deposited by setting the target bias to tens of V. If the target bias is set at 10 V or lower, no film is deposited. In this case only the plasma irradiation of the base can be realized without deposition of the film. Since the level of the plasma potential, ion dispersion in the sheath region, and dispersion of atoms sputtered from the target until they reach the substrate affect the film, the conditions cannot be expressed only by the value of the target bias.

As a method of alternately switching between the film deposition step and the step in which only the plasma irradiation is performed, a method may be employed in which a shutter is disposed adjacent to the surface of the target to perform switching or another method may be employed in which the discharge pressure is controlled.

For example, an apparatus arranged as shown in FIG. 4 is used in such a manner that a mixture of Ar gas and hydrogen gas is allowed to flow in the chamber with the film forming chamber exhausted to a vacuum state. The target bias is set at, for example, −150 V with the pressure controlled to several mTorr to tens of mTorr. As a result, the film deposition is performed. If the film deposition rate is, for example, 1 Å/sec, a film having a thickness of tens of Å can be deposited in one deposition step by setting the target bias to −150 V for tens of seconds.

If the target bias is then set at, for example, −5 V, no film deposition occurs and only the plasma irradiation can be performed. The capability of switching the film deposition step and the plasma deposition step by only controlling the target bias is one of the significant advantages of the present invention. When the switching is performed, switching of the gas and the changing of the pressure are not required. Since only the switching of the voltage is required, the switching can be performed at a significantly high speed.

Figure 1:
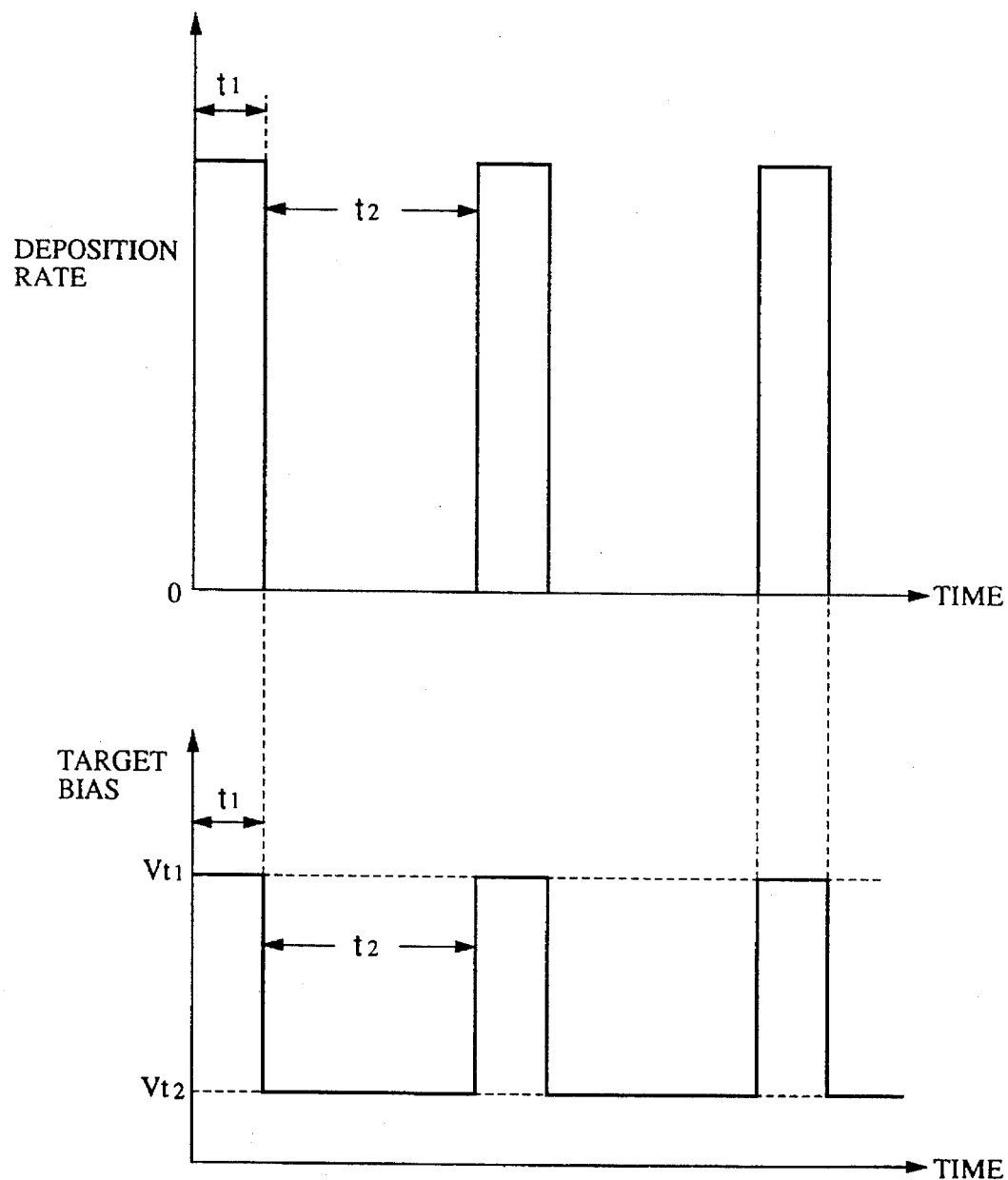
FIG. 1 is a graph showing the relation between target bias and film deposition rate according to the present invention.

FIG. 1 schematically illustrates a state where the deposition rate is controlled by switching the target bias. The target bias is set to $V_{t1}$ which is sufficiently large to deposit a film for time $t_1$. As a result, the film is deposited for the time $t_1$. Then, the target bias is set to value $V_{t2}$, which is sufficiently small to restrict sputtering of the target for time $t_2$. As a result, the film deposition does not take place but only the plasma irradiation of the surface of the deposited film occurs. The foregoing process cannot be performed by the plasma CVD method employing switching of the reactive gas as disclosed in Applied Physics Letters, Vol. 59, No. 9, p. 1096 (1991) because the gas switching response speed is too low.

Figure 3:
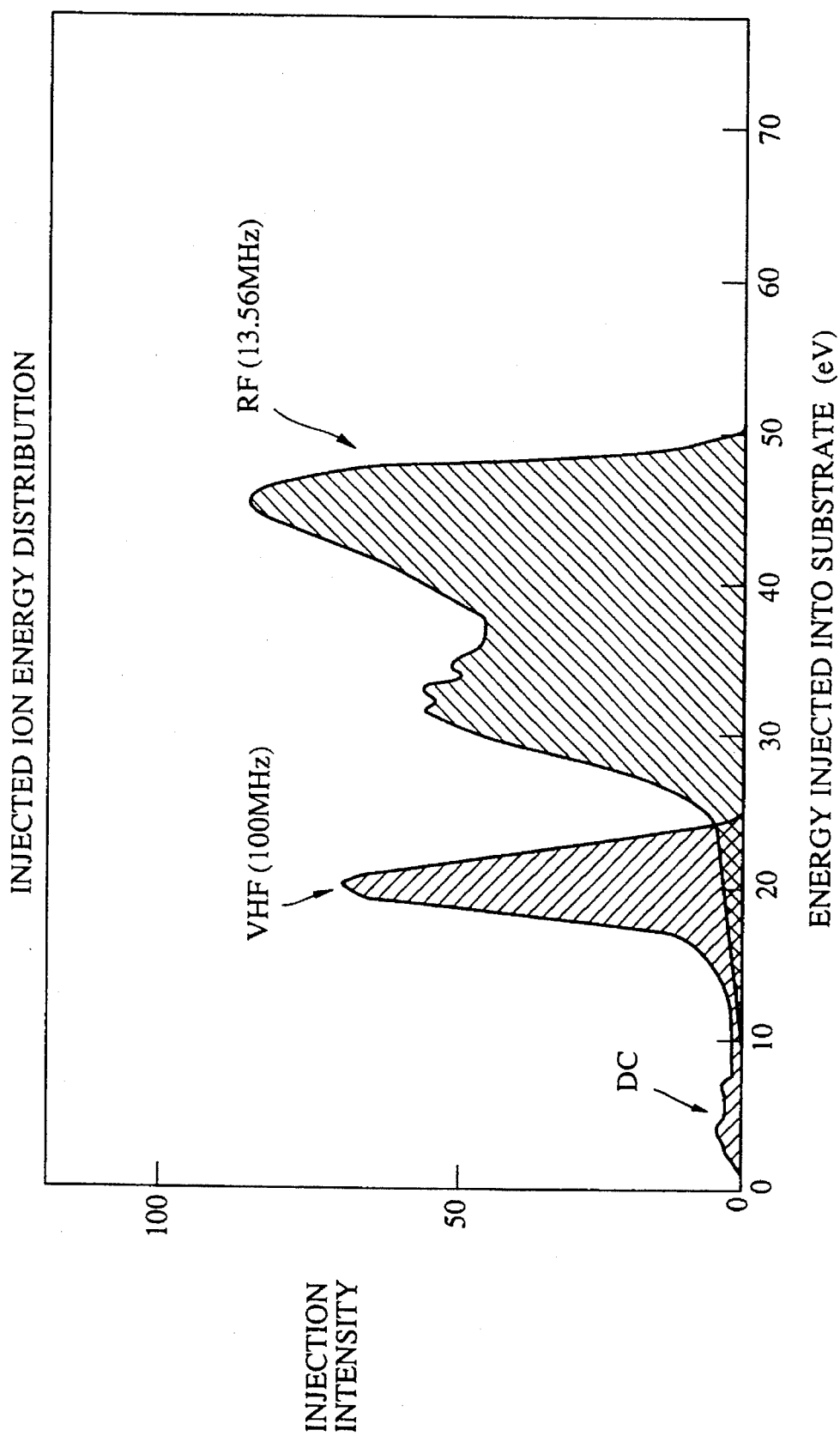
FIG. 3 is a graph showing the energy distribution of ions bombarding the substrate.

Also, the conventional reactive RF sputtering method using a low frequency which has been employed to deposit a-Si cannot realize the foregoing effect. Even if the target bias is controlled in the conventional sputtering method, undesirable introduction of high-energy ions into the target cannot completely be prevented because the ion energy distribution is too wide, as shown in FIG. 3. Therefore, it has been very difficult for the conventional methods to perform only the plasma irradiation while completely preventing the deposition. Only the present invention enables it to be realized. Further, the problem of damage of the deposited film and the substrate by ions which have been inevitably involved in the plasma irradiation process can be prevented by the present invention in such a manner that the incident ion energy on the film is precisely controlled.

During plasma irradiation, inert gas ions, such as $Ar^+$ ions, $H^+$ ions, hydrogen atoms, and inert gas atoms in an excited state are supplied to the surface of the film.

Although the detailed mechanism has not been clarified, a film having thickness d formed in time $t_1$ is irradiated with plasma in time $t_2$, as a result of which a structure relaxation takes place, causing a film in which structural defects are prevented to be formed. When the temperature of the substrate is raised, the foregoing active substances and ions can easily be dispersed in the film, causing the structural defects to be decreased. The energy of ions traveling to the surface of the film can be changed freely by controlling the substrate bias. The defects of the film can be removed from the film by using the energy of ions within a range in which no ion damage occurs.

Since the film deposition is performed in the time $t_1$ to form a network in the amorphous structure having a thickness of several nm and then the plasma irradiation is performed to enhance the structural relaxation, the problem that the structural relaxation proceeds excessively and crystallization occurs can be prevented in comparison to the case where the plasma irradiation is performed in a state where the network has not been formed completely during the film deposition. Therefore, crystallization can be prevented in comparison to various annealing methods so that an advantage of relaxing the structure while maintaining its amorphous nature can be realized. Since the quality of the film can be improved because hydrogen is contained in the discharge gas at the time of the plasma irradiation, the foregoing structural relaxation is enhanced by hydrogen.

By repeating the film deposition and the plasma irradiation in the corresponding times $t_1$ and $t_2$, a film free from defects can be formed even if its thickness is thicker than d. Since the plasma is very stable with respect to changes in the target bias from $V_{t1}$ to $V_{t2}$, the plasma is very stable immediately after the switch. Furthermore, each step can be shortened if necessary. The foregoing advantages cannot be obtained from the plasma CVD method in which the deposition and the plasma irradiation are alternately repeated by switching the gas.

Figure 2:
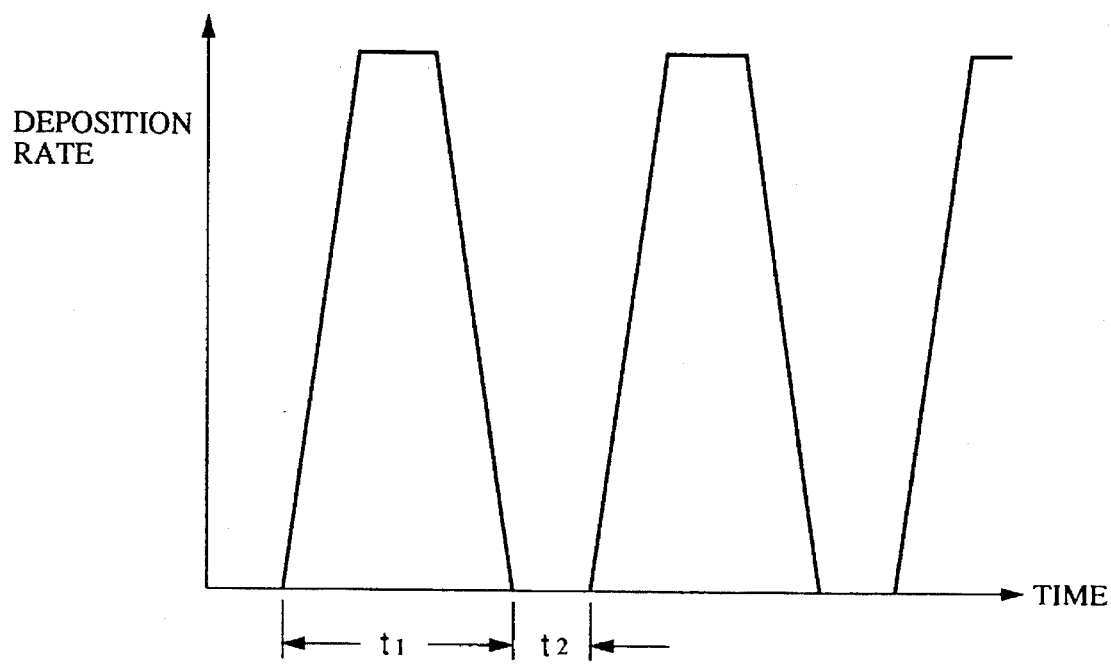
FIG. 2 is another graph showing the relation between target bias and film deposition rate according to the present invention.
Figure 2:
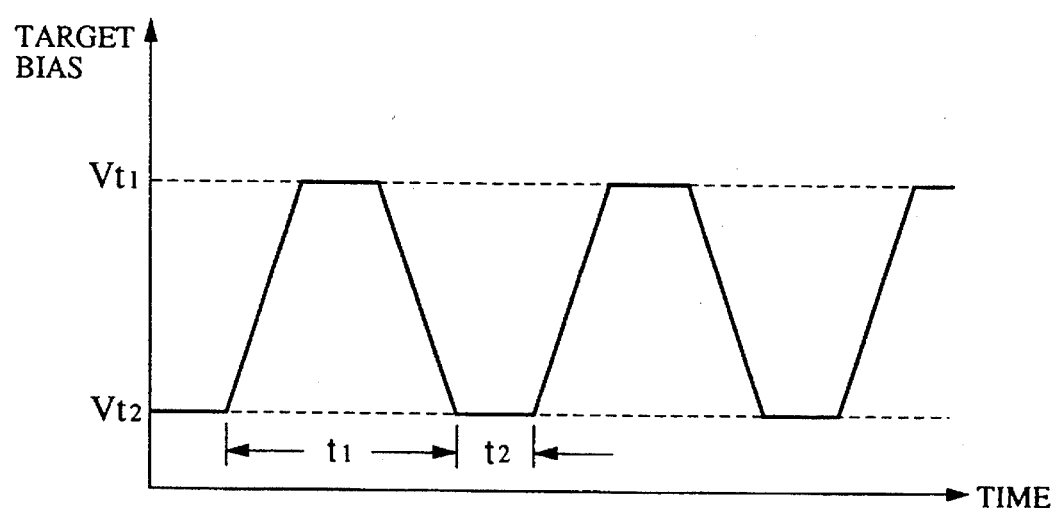

If necessary, the foregoing two steps can be switched moderately at a controlled speed in place of instantaneously switching the two steps. The foregoing arrangement may be realized very easily by applying cyclic pulses having a desired waveform to the target because the deposition rate is substantially in proportion to the target bias in a predetermined range. An example of this is shown in FIG. 2.

The thickness d of the deposited film formed in a period between two plasma irradiation processes must be 10 nm or thinner. If the thickness d is 10 nm or thicker, an effect of the plasma irradiation cannot be obtained clearly. If d is 1 nm or thinner, the total film deposition rate is decreased and an impractical result is realized. Furthermore, the photoelectrical characteristics sometimes deteriorate. Depending upon the plasma irradiation conditions, a problem arises in that a crystalline phase can easily be formed within the film.

One of the objects of the present invention is to simultaneously realize the improvement in the surface migration characteristics of atoms and prevent ion damage of the deposited film in the film deposition step $t_1$ to deposit a-Si exhibiting excellent film quality with excellent reproducibility maintained by the sputtering method having a variety of advantages as described above. Also in the plasma irradiation step, the deposited film must be protected from ion damage. An important way to prevent this is to raise the discharge frequency to a level higher than the 13.56 MHz which is usually used. If the discharge frequency is raised to 50 MHz, preferably 100 MHz or higher, the energy distribution of ions incident upon the substrate, as shown in FIG. 3, has its peak shifted considerably to the low-energy side. Therefore, bias control of the substrate and the target enable the energy of ions incident on the base to be precisely controlled.

If the bias of the substrate and/or the target is controlled during the film formation to irradiate with ions the surface on which the film is growing, the surface migration characteristics of atoms sputtered from the target can be enhanced on the surface on which the film is growing as compared with the case where no ion irradiation is performed. Therefore, the structural defects, such as dangling bonds in the film, can be decreased as well as decreasing projections and pits in the surface. As a result, the characteristics of the film serving as a semiconductor can be improved. Although the mechanism enabling the foregoing effect to be obtained due to the ion irradiation has not been clarified yet, it can be considered that ions give momentum to atoms forming the film on the surface on which the film is growing, ions give atoms energy on the surface on which the film is growing, or ion irradiation raises the temperature of the surface on which the film is growing.

If an excessively large positive substrate bias is applied, the quality of the deposited film deteriorates because it contains a columnar structure or the electrical conductivity under irradiation with light deteriorates. The reason for this is that the ion energy is insufficient to cause the migration of Si atoms on the surface on which the film is growing. If an excessively large negative bias is applied, the quality of the film also deteriorates. The reason for this is that the ion energy is increased excessively and the deposited a-Si film is damaged by the ion bombardment. Therefore, the ion irradiation energy must be controlled to a predetermined optimum value.

Since the ion energy distribution in the plasma is narrow in a frequency region of 50 MHz or higher, the energy of ions to be made incident upon the surface of the base is substantially determined by the difference between the substrate bias and the plasma potential. Since the plasma potential is affected by the target bias as well as by the discharge pressure and by the discharge power, they must be collectively controlled. The control can be performed easily. As a result, ions in the discharge gas, for example, $Ar^+$ ions are given sufficient energy to be applied to the surface on which the a-Si is growing. The foregoing effect can be obtained in a sputtering method using discharge pressure of about $10^{-4}$ to $10^{-2}$ Torr. The RF plasma CVD method using discharge pressure of $10^{-2}$ to 1.0 Torr cannot provide a satisfactory effect.

Since the plasma potential is changed by the target bias, discharge frequency, discharge power, discharge pressure, discharge gas substances, mixture ratio of the hydrogen gas, the temperature of the substrate, the shape of the film forming chamber and that of the target (in particular, area ratio) and so forth, the optimum value of the level of the substrate bias cannot simply be determined by the voltage. It is usually suitable that it is about $-10$ V to $+30$ V. The optimum values are in a narrow range about the central value of $\pm 10$ V. The quality of the formed a-Si film is sensitive to the substrate bias and a change in the order of 1 V is sufficiently effective to control the quality of the film under predetermined discharging conditions. Further specific conditions will be described in the Examples.

Since the conventional bias control using a frequency of 13.56 MHz enables only more insensitive change to be obtained, control in the range of about tens of V to 100 V is required. However, the quality of the film cannot be improved considerably and the film is sometimes damaged by high-energy components of ions impinging the base even if the bias is raised. Therefore, it is difficult for the conventional reactive sputtering method to precisely control the quality of the film with satisfactory reproducibility maintained. The incident energy of ions on the surface of the substrate can be measured by disposing an ion energy analyzer at the position at which the substrate is disposed under the same conditions as the conditions for forming the film. Although simultaneous monitoring of the ion energy during the film formation cannot easily be performed, the optimum value for the ion energy ranges from several eV to tens of eV. The foregoing conditions vary depending upon a-Si and various a-Si alloys, and the same is changed due to the temperature of the substrate.

By evaluating the quality of the formed a-Si film more phenomenologically, the optimum bias value under specific conditions can be obtained. In any case, sufficient ion energy must be applied. If a discharge frequency of 50 MHz or higher is used, the absolute value of the spontaneous bias of the insulated substrate can be made smaller and the average ion energy can be made smaller by optimizing the other plasma conditions. Therefore, the ion incident energy can be reduced even in a floating substrate, and a-Si having excellent characteristics can be obtained according to the present invention.

Another basic point of the present invention is to make the film amorphous. Making the film amorphous enables the following characteristics, which cannot be realized by crystalline films: intense light absorption superior to that of crystalline films, more isotropic and uniform quality of the films than that of crystalline films, excellent controllability with which the physical properties can be changed continuously by mixing a multiplicity of elements with one another at an arbitrary ratio, a capability of forming the film on a substrate made of any of a variety of materials while being free from lattice constant restraints, and a low temperature process with which material can be deposited on glass, the melting point of which is low or on metal at a temperature which does not raise a problem of metal diffusion.

The amorphous structure must be formed by the film deposition in the time $t_1$. The amorphous structure can be formed by any of a variety of methods. For example, the high-frequency bias sputtering method disclosed in Journal of Applied Physics, Vol. 66, No. 10, p. 4756 (1989) enables the amorphous structure to be formed by positively biasing the substrate. However, the foregoing conditions, in which hydrogen is not substantially contained and the surface, on which the film is growing, is intensely bombarded by ions, causes the influence of the ion damage to become critical in order to deposit excellent a-Si. Also, the deposition method of hydrogenated a-Si according to the present invention is able to employ the foregoing method and the deposited films can be made amorphous by bringing the substrate bias to the negative side. This permits the ion irradiation energy during the film deposition to be controlled. That is, the ion impulses break the crystal lattice. However, the foregoing method is unsatisfactory for forming a film having excellent quality because the ion damage of the film is critical. Therefore, the method in which the substrate bias is made to be negative cannot be used as a method of obtaining excellent a-Si.

If the temperature of the base is raised considerably, the quality of the film can be somewhat improved. If single crystal or polycrystal Si is used as the substrate, excessive increase of the temperature of the substrate causes crystalline Si to grow. Therefore, the temperature of the base has a limitation.

By bringing the substrate bias close to 0 V or to the positive side and by lowering the temperature of the substrate, a-Si can be deposited. The foregoing method sometimes encounters excessively large projections and pits in the surface to not provide excellent quality of the film. If the ion energy is increased by controlling the substrate bias, the quality of the film can be improved. A modification of the foregoing method may be employed in which large ion energy and/or low temperature of the base are employed to deposit a thin and defective a-Si layer on a Si crystal and high temperature of the substrate and small ion energy are employed to deposit excellent a-Si. It is preferable that the temperature be 150° to 450° C., although it depends on the magnitude of the ion energy during the film deposition. By exposing the surface of the Si crystal to a plasma of a fluorine-containing gas such as $CF_4$, $SiF_4$, $F_2$, HF or the like or their dilution gases or by employing a wet method, a-Si can be deposited even if the temperature of the substrate is raised or if the ion energy is reduced.

Another method may be employed in which the substrate is made of quartz or glass or amorphous material such as polyamide or polycarbonate. The foregoing method prevents the growth of crystalline Si even when the temperature of the substrate is high and the ion energy is small. As a result, excellent a-Si can be deposited. However, excessive raising of the temperature of the base sometimes causes polycrystalline Si to grow. The specific conditions will be described in the Examples described later.

Si of another type and crystals having a different lattice constant may be employed as the substrate. The foregoing method employs polycrystals as well as single crystals. In this method, any of various materials may be employed, for example, semiconductor material such as GaAs or ZnS, insulating material such as MgO, alumina, BN or diamond, metal or other conductive material such as graphite, Al, Ni, Cr or stainless steel, and other known crystalline materials.

By raising the concentration of hydrogen added to Ar, a-Si can be deposited. Also, the foregoing method enables a-Si to be deposited even if the temperature of the substrate is raised considerably and if the ion energy is small. The concentration of hydrogen in the deposited a-Si film is sometimes raised considerably.

Since various methods can be employed to form the amorphous structure, any method meeting the requirements may be employed. Since it is important to control the ion irradiation energy when the film deposition and the plasma irradiation are alternately repeated, it is preferable to combine a high-frequency bias sputtering method using 50 MHz or higher with the selected method.

When a-Si is deposited by the method according to the present invention, the pressure of gases besides Ar and hydrogen in the discharge gas, such as $H_2O$, $N_2$, $O_2$, or $CO_2$, must be low in order to deposit an excellent film containing reduced impurities. The foregoing gases are undesirable because they are included in the film and cause defects to occur and they raise a possibility of obstructing the surface transference of deposited atoms during the film deposition. Accordingly, it is preferable that the pressure of gases except Ar and hydrogen in the film forming chamber, that is, the background pressure, be $10^{-6}$ Torr or lower, preferably $10^{-7}$ Torr or lower. In order to cause the effect of enhancing the surface migration characteristics of atoms by the ion radiation to be exhibited, which is the characteristic of the present invention, the background pressure must be $10^{-8}$ Torr or lower. In an environment which contains few impurities, the surface of the film can be protected from contamination during the plasma irradiation step performed between two deposition steps. It is preferable that pure Ar and hydrogen gas be used to form the film. The gas should flow through a gas refining apparatus immediately before it is introduced into the film forming chamber and, to protect the gas from contamination in the gas pipes, the inside portions of the SUS pipes are subjected to a passivation process or any of a variety of methods known in the semiconductor field.

As the discharge gas for use in forming the film by sputtering, an inert gas, such as He, Ne, Ar, Xe, or Kr, may be used similarly to a usual sputtering operation. If the frequency is 50 MHz or higher, particularly 100 MHz or higher, the width of the ion energy distribution does not increase considerably differently except for He, as experienced with the case where a frequency of 13.56 MHz is used. Although a somewhat wide energy distribution is realized if He is used, the ion damage can be prevented considerably. Therefore, any of the foregoing gases can be selected as desired. Two or more of the foregoing gases may be mixed together if necessary. Although it is preferable that the discharge pressure be several to tens of mTorr, it is not limited to the foregoing range. If the ratio of the inert gas ions with respect to Si atoms made incident on the substrate during the film formation is too low, the effect of enhancing the surface migration characteristics of Si atoms due to the ions becomes unsatisfactory, and the structural relaxation cannot proceed, causing the quality of the film to deteriorate. If Ar is used, the atom ratio Ar/Si must be about 0.1. The foregoing value can be controlled by the amount of the target bias, the substitute bias, the discharge, and the discharge pressure.

Although the partial pressure of hydrogen mixed with the inert gas cannot be determined independently because its optimum value varies due to the conditions, it may be about several mTorr. It may be 1 mTorr or less to obtain a satisfactory effect. Ar gas containing hydrogen may be introduced in a controlled quantity into the film forming chamber in which the film is deposited, or hydrogen and Ar may be individually introduced into the film forming chamber with the flow rate controlled to mix them in the film forming chamber. Hydrogen gas decreases dangling bonds. The ratio of hydrogen atoms must be 0.1 at % or higher with respect to Ar atoms. If the ratio is lower than the foregoing value, the effect of adding hydrogen cannot be obtained clearly. Thus, hydrogen is contained in the deposited a-Si film. It is not suitable to use hydrogen present as an impurity in the discharge gas or present as residual gas in the film forming chamber because the controllability of the characteristics of a-Si becomes unsatisfactory.

Since hydrogen considerably affects the characteristics of a-Si, it is necessary to control hydrogen when it is introduced. Although the quantity of Ar and that of hydrogen can be controlled by using a simple flow rate meter, it is preferable to use a mass flow controller or the like which is capable of controlling the flowing mass. If the quantity can be controlled, any control method may be employed.

The ratio of Ar and hydrogen may be varied during the film formation. The foregoing ratio may be controlled by a known method for use in the conventional sputtering method or the plasma CVD method, as known or after adequate modification. Hydrogen may be that having an atomic weight of about 1.0 and present in the largest quantity, or an isotope such as heavy hydrogen or tritium may be used. When crystalline Si is allowed to grow, hydrogen is not required. If hydrogen is present, the crystal sometimes includes a defect. Therefore, the addition of hydrogen enables a significant effect to be obtained when a-Si is deposited.

As the material of the target, pure polycrystal Si or single crystal Si may be used when a-Si is intended to be deposited. The foregoing materials are convenient because they are easily available. If necessary, a target made to be amorphous may be used. It is preferable that the target be made of pure material. If necessary, a specific impurity for controlling the electroconductivity, for example, P, As, or Sb in Group IIIb or B, Al, or Ga in Group Vb or a substance containing an impurity such as Li or Bi capable of controlling the conductivity may be used. The foregoing impurity contained in the target is contained in the deposited film at a considerably high ratio. As a result, n- or p-type deposited films can be formed. Although an inert element, such as hydrogen or Ar, may be contained in the target, it may be supplied as gas into the film forming chamber to improve the controllability.

If a-SiGe, a-SiC, a-SiSn, a-SiN, a-SiO, or the like is formed, a corresponding alloy target made of SiGe, SiC, SiSn, SiN, or SiO may be used. The concentration ratio of the impurity and the alloy element can be controlled by selecting the concentration ratio of the target. Different targets may be simultaneously used such as Si and Ge, Si and graphite, or Si and Sn.

If a-SiGe is deposited by the reactive sputtering method according to the present invention, use of, for example, $GeH_4$, which is an expensive and explosive substance required in the plasma CVD method, can be omitted. Therefore, the cost of the raw material gas can be reduced, and the gas supply pipe, gas leakage alarm system, and exhaust gas processing system and the like can be simplified, causing significant advantages to be realized. If a portion of the semiconductor component element can be supplied in the form of gas such as a-SiN or a-SiO, mixing it with Ar similarly to hydrogen enables a film to be deposited using only a Si target. In this case, any of various methods employed in the conventional sputtering method may be employed.

Although the target and substrate bias control may be performed by applying a DC bias, it is difficult to control the bias on the surface of a substrate having a high resistance. It is sometimes difficult to control the bias depending upon the material of the target, such as SiC, because the film to be deposited has a high resistance. Since a-Si has a considerably large resistance if the concentration of the dopant impurity is low, there sometimes arise cases where it is difficult to control the bias of the surface of the substrate by a simple application of the DC bias. In this case, a known method (see Japanese Patent Laid-Open No. 63-50025) may be employed in which high frequency waves are applied to the base and the bias is controlled with the spontaneous bias. In this case, the spontaneous bias can be controlled by controlling the power for supplying the high frequency waves to the substrate.

A method may be employed which comprises the step of sufficiently raising the discharge frequency to be applied to the target to reduce the spontaneous bias of the insulating substrate. The DC bias may be applied to the target as well as to the substrate. By applying a negative DC bias to the target, the deposition rate can be raised. The foregoing method realizes a deposition rate of several angstroms/sec to tens of angstroms/sec. The foregoing value is significantly larger than that obtainable from the usual plasma CVD method.

As the material for the substrate according to the present invention, single crystal Si, polycrystal Si, a-Si, or a compound containing Si may be used. However, an insulating substance, such as $SiO_2$ or dopant-containing glass, cannot easily be provided with the substrate bias. Therefore, the spontaneous bias is sometimes raised excessively depending upon the discharge conditions or upon the balance of the arrangement to obtain an excellent film. In this case, the twin-frequency exciting method improves the quality of the film. As an alternative to this, metal such as Al, stainless steel or the like, a transparent electrically conductive substance such as ITO or organic polymer such as polycarbonate, polyurethane, polystyrene, polyimide, or the like may be used. A substance having a large resistance must be subjected to a process for restricting its spontaneous bias within a desirable range. By using a discharge frequency of 50 MHz or higher, preferably 100 MHz or higher according to the present invention, the spontaneous bias can be held at a practical level, for example, +5 to 20 V.

A method in which a magnet or a coil is disposed adjacent to the target to form a magnetic field in the plasma to raise the density of the plasma to improve the deposition rate is a very effective method similar to the conventional sputtering method. For example, a magnet is disposed on the reverse side of the target as is usually performed in the conventional sputtering method to raise the density of the plasma. Cooling of the target and holding of the target may be performed by methods employed in the conventional sputtering method.

FIG. 4 is a schematic view which illustrates an example of an apparatus for use in the present invention. A vacuum chamber 201 for forming the film is exhausted to a vacuum state by an exhaust apparatus comprising: a turbo molecular pump 203 connected by an exhaust duct 202 containing butterfly valve 217; and a rotary pump 204. In the vacuum chamber 201, a high-frequency electrode in a parallel and flat form and integrally formed with a substrate susceptor 206 and a target susceptor are disposed so that high frequency plasma is generated in the chamber 201 due to capacitive coupling. A target 208 is connected to a high-frequency power source 212 through a matching box 211 so that high frequency is applied to the target. The high-frequency source 212 must emit a frequency of 50 MHz or higher, preferably 100 MHz or higher. The target is connected to a DC bias electric power source 214 through a low-pass filter. A magnet 209 may be disposed on the reverse side of the target to raise the density of the plasma. Also, the substrate susceptor 206 is connected to another DC bias electric power source 214 through another low-pass filter 213. The bias applying apparatus connected to the substrate may be a high frequency power source in place of the DC power source, if necessary. The substrate on which the film will be deposited is placed on the susceptor 206. The substrate can be heated by a heater 207. Pure Ar gas can be introduced from an Ar gas cylinder 216 through a gas pipe 223 by way of a gas refining apparatus 215. The quantity of the Ar gas can be controlled by a mass flow controller 218 attached to the gas pipe 223. Similarly, hydrogen gas can be supplied from a hydrogen gas cylinder 220 through a gas pipe 221 by way of a gas refining apparatus 219 and mass flow controller 222.

The present invention will now be described with reference to specific examples.

EXAMPLE 1

A method of forming a film of a-Si by using the apparatus shown in FIG. 4 will now be described.

A single crystal FZ Si wafer, the diameter of which was 120 mm, the thickness of which was 1 mm, and the bulk resistance of which was 1500 Ωcm, was used as the target. As the discharge gas, a mixed gas of Ar, the $H_2O$ dew point of which was −99.6° C. or lower, and hydrogen was used. Since the electric resistance of the target was large and therefore the target bias cannot be applied, boron ions were previously implanted by an ion implanter to the reverse side of the target so that an ohmic contact with the bias electrode was established.

The substrate was a Si wafer on which an oxide film having a thickness of 400 Å was formed by heating and oxidizing the surface of the substrate. The substrate was secured on the substrate susceptor in the film forming chamber, and the film forming chamber was exhausted to a negative pressure level of $5 \times 10^{-10}$ Torr. Then, the heater in the susceptor was used to heat the substrate to 370° C. at its surface.

Then, only Ar was allowed to flow in the film forming chamber, and the pressure was set to 7 mTorr. Initially, discharge was performed under conditions that the target bias was −5 V, the substrate bias was +5 V and the discharge power was 5 W. Then, the surface of the substrate was cleaned by ion bombardment. The discharge frequency was 100 MHz.

While maintaining the vacuum state, hydrogen was mixed with Ar and flow of the mixture was continued, so that a-Si was deposited on the thus-cleaned substrate in such a manner that the temperature of the substrate was 370° C. The discharge frequency was 100 MHz. A rectangular voltage pulse was used in such a manner that the target bias was −300 V during the film deposition step in the time $t_1$ and −5 V during the plasma irradiation step in the time $t_2$. The other discharge conditions were the same between the time $t_1$ and the time $t_2$. That is, the substrate bias was +20 V, the discharge power was 100 W, the discharge pressure of the mixture gas of Ar and hydrogen was 7 mTorr, and the partial pressure of hydrogen was 0.7 mTorr. When the film was deposited on the $SiO_2$-film-formed Si wafer under conditions that the time $t_1$ was 5 seconds and the time $t_2$ was 20 seconds, the deposition rate in the apparatus was about 1.5 Å/sec. The thickness of the deposited film was made to be 4000 Å.

Analysis performed by an electron diffraction method resulted in a halo pattern and neither a crystal ring pattern nor a spot pattern appeared. Thus, formation of an amorphous structure was confirmed. The concentration of hydrogen in the film was about 3 at % as a result of an analysis of infrared absorption spectrum, without absorption adjacent to 2090 to 2150 $cm^{-1}$ due to $SiH_2$ bonds or $SiH_3$ bonds. An ESR measurement. determined that the spin density of the deposited film was about $5 \times 10^{-15}$ $cm^{-3}$. The electrical conductivity under irradiation with light (AM1) was $2 \times 10^5$ $Scm^{-1}$ and the dark conductivity was $4 \times 10^{-10}$ $Scm^{-1}$. Thus, substantially no deterioration in the electrical conductivity due to light was confirmed.

As a result of an observation using a scanning electron microscope, the surface of the film was determined to be considerably flat. An observation of the cross-section showed no columnar structure present. The film contained significantly reduced impurities except hydrogen, and no other substance was detected except Ar. The quantity of Ar was in the order of $10^{19}$ $cm^{-3}$. Thus, the method according to the present invention is able to form a film exhibiting high purity and having a low spin density although it contains hydrogen at a very low concentration.

In order to make a comparison, a film was deposited in such a manner that $t_2$ was set at 0 second, the plasma irradiation step was omitted and the other conditions were the same. The concentration of hydrogen in the film was about 8 at %, and the spin density in the film was $2 \times 10^{-16}$ $cm^{-3}$. Although the photoelectric characteristics were allowable, the deterioration by light was excessive.

EXAMPLE 2

The apparatus shown in FIG. 4 was used and an a-Si film was formed as follows.

As a target, n-type polycrystal Si which contained phosphorus, the diameter of which was 150 mm, the thickness of which was 2 mm, and the bulk resistance of which was 0.2 Ωcm, was used. As the discharge gas, a mixed gas of Ar and hydrogen was used. The substrate was an Al plate completely degreased and dried. The substrate was secured on the substrate susceptor in the film forming chamber, and the pressure in the film forming chamber was exhausted to a negative pressure level of $10^{-8}$ Torr or lower. Then, the heater in the susceptor was used to heat the substrate to 350° C. at its surface.

Then, only Ar was allowed to flow in the film forming chamber, and the pressure was set to 10 mTorr. Initially, discharge was performed under conditions such that the target bias was −5 V, the substrate bias was +5 V, and the discharge power was 5 W. Then, the surface of the substrate was cleaned by ion bombardment. The discharge frequency was 100 MHz.

While maintaining the vacuum state, a mixture of Ar and hydrogen gases was allowed to flow. Thus, a-Si was deposited on the cleaned substrate in such a manner that the temperature of the substrate was 350° C. The discharge frequency was 100 MHz, and the target bias was −150 V in the time $t_1$ and −5 V in the time $t_2$. The substrate bias was +20 V, the discharge power was 100 W, the discharge pressure of the mixture of Ar and hydrogen was 10 mTorr, and the partial pressure of hydrogen was 1 mTorr. The time $t_1$ was 7 seconds and the time $t_2$ was 30 seconds. The deposition rate on the Al substrate was about 0.5 Å/sec.

Analysis performed by an electron diffraction method resulted in a halo pattern and neither a crystal ring pattern nor a spot pattern appeared. Thus, formation of an amorphous structure was confirmed. As a result of observation of the cross-section of the film, the columnar structure frequently observed in films deposited by the conventional sputtering method was not observed. Thus, deposition of a precise film was confirmed. The concentration of hydrogen in the film was about 4 at % as a result of an analysis of the infrared absorption spectrum, without absorption adjacent to 2090 to 2150 $cm^{-1}$ due to $SiH_2$ bonds or $SiH_3$ bonds. The concentration of Ar in the film was low, in the order of $10^{17}/cm^{-3}$.

EXAMPLE 3

The apparatus shown in FIG. 4 was used, so that an a-Si film was formed similarly to the above Examples.

A single crystal of Si, the diameter of which was 150 mm, the thickness of which was 2 mm, and the bulk resistance of which was 1500 Ωcm, was used as the target. As the discharge gas, a mixed gas of Ar, the $H_2O$ dew point of which was −99.6° C., and hydrogen was used. Boron ions were previously implanted by an ion implanter into the reverse side of the target so that an ohmic contact with the bias electrode was established. The substrate was Corning #7059 glass degreased completely and then dried.

The substrate was secured on the substrate susceptor in the film forming chamber, and the film forming chamber was exhausted to a negative pressure level of $10^{-8}$ Torr or lower. Then, the heater in the susceptor was used to heat the substrate to 400° C. at its surface.

Then, only Ar having a dew point which was similar to that of the foregoing example was allowed to flow into the film forming chamber, and the pressure was set to 10 mTorr. Initially, discharge was performed under conditions such that the target bias was −5 V, the substrate bias was the spontaneous bias, and the discharge power was 5 W. Then, the surface of the substrate was cleaned by ion bombardment. The discharge frequency was 100 MHz.

While maintaining the vacuum state, the mixture of Ar and hydrogen gas was allowed to flow continuously, so that a-Si was deposited on the thus-cleaned substrate in such a manner that the temperature of the substrate was 400° C.

The discharge frequency was 100 MHz. The target bias in the time $t_1$ was −300 V, that in the time $t_2$ was −5 V, the substrate bias was the spontaneous bias of +12 V, the discharge power was 100 W, the discharge pressure of the Ar and hydrogen mixture was 10 mTorr, and the partial pressure of hydrogen was 1 mTorr. When film deposition was performed on the #7059 glass substrate in such a manner that $t_1$ was 5 seconds and $t_2$ was 20 seconds, the deposition rate was about 0.6 Å/sec, similarly to Example 1.

Analysis performed by an electron diffraction method resulted in a halo pattern and neither a crystal ring pattern nor a spot pattern appeared. Thus, formation of an amorphous structure was confirmed. The concentration of hydrogen in the film was about 2.0 at % as a result of an analysis of the infrared absorption spectrum, without absorption adjacent to 2090 to 2150 cm$^{-1}$ due to SiH$_2$ bonds or SiH$_3$ bonds. An ESR measurement determined that the spin density of the deposited film was about $10^{-15}$ cm$^{-3}$ or lower. The electrical conductivity under irradiation with light (AM1) was 1×10$^5$ Scm$^{-1}$ and the dark conductivity was 1×10$^{-10}$ Scm$^{-1}$. Substantially no deterioration in the electrical conductivity due to light was observed.

As a result of an observation using a scanning electronic microscope, the surface of the film was determined to be considerably flat. An observation of the cross-section determined that no columnar structure was observed. The film contained significantly reduced impurities except hydrogen, and no other substance was detected except Ar. The quantity of Ar was about 3×10$^{17}$ cm$^{-3}$.

The substrate was replaced by quartz having a thickness of 0.5 mm and deposition was performed under the same conditions. As a result, an a-Si film having similar characteristics as those of the film formed on the #7059 glass was obtained.

EXAMPLE 4

The apparatus shown in FIG. 4 was used, so that an a-Si film was formed similarly to the Examples described above.

A p-type single crystal Si, the bulk resistance of which was 0.2 Ωcm and which contained boron, was used as the target. As the discharge gas, a mixed gas of Ar, the H$_2$O dew point of which was −100° C., and hydrogen was used. The substrate was an n-type Si single crystal wafer previously immersed in a mixed solution of heated sulfuric acid and hydrogen peroxide, the mixed solution then being removed. Then, the substrate was cleaned with hydrofluoric acid and pure water before it was dried completely.

The substrate was secured on the substrate susceptor in the film forming chamber, and the film forming chamber was exhausted to a negative pressure level of 10$^{-8}$ Torr or lower. Then, the heater in the susceptor was used to heat the substrate to 350° C. at its surface.

Then, only Ar having a dew point which was similar to that of the foregoing example was allowed to flow into the film forming chamber, and the pressure was set to 10 mTorr. Initially, discharge was performed under conditions such that the target bias was −5 V, the substrate bias was +5 V, and the discharge power was 5 W. Then, the surface of the substrate was cleaned by ion bombardment. The discharge frequency was 50 MHz.

While maintaining the vacuum state, the mixture of Ar and hydrogen gas was allowed to flow continuously so that a-Si was deposited on the thus-cleaned substrate in such a manner that the temperature of the substrate was 350° C. The time t$_1$ was 15 seconds, t$_2$ was 30 seconds, and the discharge frequency was 50 MHz. The target bias was −350 V, the substrate bias was +25 V, the discharge power was 80 W, the discharge pressure of the mixed gas of Ar and hydrogen was 8 mTorr, and the partial pressure of hydrogen was 0.07 mTorr.

When film deposition was performed on the Al substrate, the deposition rate was about 2.5 Å/sec in this apparatus. Analysis performed by an X-ray diffraction method resulted in a halo pattern and neither a crystal ring pattern nor a spot pattern was observed. Thus, formation of an amorphous structure was confirmed. The concentration of hydrogen in the film was about 4.0 at % as a result of an analysis of the infrared absorption spectrum. The film was flat, having no columnar structure. The concentration of Ar was low, about 7×10$^{-18}$ cm$^{-3}$. Thus, an excellent a-Si film was obtained.

EXAMPLE 5

The apparatus shown in FIG. 4 was used, so that an a-SiGe alloy film was formed.

A polycrystal SiGe alloy (30 at % Ge) having a diameter of 150 mm and a thickness of 2 mm was used as the target. As the discharge gas, a mixed gas of Ar, the H$_2$O dew point of which was −100° C., and hydrogen was used. The substrate had a thermally oxidized film having a thickness of about 400 Å formed on a p-type Si wafer, the electric resistance of which was 0.2 Ωcm, and the thickness of which was 0.5 mm. The cleaning process was performed by a method similar to that according to Example 4.

The substrate was secured on the substrate susceptor in the film forming chamber, and the film forming chamber was exhausted to a negative pressure level of 10$^{-9}$ Torr or lower. Then, the heater in the susceptor was used to heat the substrate to 360° C. at its surface.

Then, only Ar was allowed to flow in the film forming chamber, and the pressure was set to 15 mTorr. Initially, discharge was performed under conditions such that the target bias was −5 V, the substrate bias was spontaneous bias, and the discharge power was 5 W. Then, the surface of the substrate was cleaned by ion bombardment. The discharge frequency was 200 MHz.

While maintaining the vacuum state, the mixture of Ar and hydrogen gas was allowed to flow continuously, so that a-SiGe was deposited in such a manner that the temperature of the substrate was 360° C. The discharge frequency was 200 MHz. The target bias was −100 V, the substrate bias was the spontaneous bias of +8 V, the discharge power was 100 W, the discharge pressure of the mixed gas of Ar and hydrogen was 15 mTorr, and the partial pressure of hydrogen was 0.2 mTorr.

When film deposition was performed on the substrate, the deposition rate was about 1.4 Å/sec in this apparatus. Analysis performed by an X-ray diffraction method resulted in a halo pattern and neither a crystal ring pattern nor a spot pattern was observed. Thus, formation of an amorphous structure was confirmed.

The concentration of hydrogen in the film was about 3 at % as a result of an analysis of the infrared absorption spectrum, without absorption adjacent to 2090 to 2150 cm$^{-1}$ due to SiH$_2$ bonds or SiH$_3$ bonds. Absorption due to expansion/contraction of Ge-H was observed adjacent to 1900 cm$^{-1}$. Thus, bonding of hydrogen to Ge was confirmed. The concentration of Ge was near the concentration of that in the target. The spin density of the deposited film, which was measured by the ESR method, was about 2×10$^{-16}$ cm$^{-3}$.

As a result of an observation performed with a scanning electron microscope, the surface of the film was determined to be flat. Moreover, no columnar structure was confirmed in the observation of the cross-section. Ar was present in the order of 10$^{18}$ cm$^{-3}$. The band gap was about 1.43 eV.

EXAMPLE 6

The apparatus shown in FIG. 4 was used, so that an a-Si film was formed. An Xe gas cylinder was used in place of the Ar gas cylinder 216. A single crystal FZ Si wafer having a diameter of 120 mm, a thickness of 1 mm, and a bulk resistance of 1500 Ωcm, was used as the target. As the discharge gas, a mixed gas of Xe, the $H_2O$ dew point of which was −99.6° C. or lower, and hydrogen was used. Since the electrical resistance of the target was too large to easily take the target bias, boron was previously implanted in the reverse side of the target by an ion implanter so that ohmic contact with the bias electrode was established. The substrate was a Si wafer having an oxide film formed by thermal oxidation of the surface thereof and having a thickness of 400 Å.

The substrate was secured on the substrate susceptor in the film forming chamber, and the film forming chamber was exhausted to a negative pressure level of $10^{-9}$ Torr or lower. Then, the heater in the susceptor was used to heat the substrate to 400° C. at its surface.

Then, only Xe was allowed to flow in the film forming chamber, and the pressure was set to 15 mTorr. Initially, discharge was performed under conditions such that the target bias was −5 V, the substrate bias was spontaneous bias, and the discharge power was 5 W. Then, the surface of the substrate was cleaned by ion bombardment. The discharge frequency was 100 MHz.

While maintaining the vacuum state, a mixture of Xe and hydrogen gas was allowed to flow continuously, so that a-Si was deposited on the thus-cleaned substrate in such a manner that the temperature of the substrate was 400° C. The discharge frequency was 75 MHz. The target bias was −300 V, the substrate bias was the spontaneous bias, the discharge power was 100 W, the discharge pressure of the mixed gas of Xe and hydrogen was 15 mTorr, and the partial pressure of hydrogen was 0.1 mTorr.

When film deposition was performed on the Si wafer substrate provided with the $SiO_2$ film in the time $t_1=3$, the deposition rate was about 6 Å/sec in this apparatus. Analysis performed by an X-ray diffraction method resulted in a halo pattern and neither a crystal ring pattern nor a spot pattern was observed. Thus, formation of an amorphous structure was confirmed.

The concentration of hydrogen in the film was about 7 at % as a result of an analysis of the infrared absorption spectrum, without absorption adjacent to 2090 to 2150 $cm^{-1}$ due to $SiH_2$ bonds or $SiH_3$ bonds. The spin density of the deposited film measured by the ESR method was $10^{-16}$ $cm^{-3}$ or lower. The electrical conductivity under irradiation with light (AM1) was $1\times10^5$ $Scm^{-1}$ and the dark conductivity was $8\times10^{-11}$ $Scm^{-1}$. Thus, substantially no deterioration in the electrical conductivity due to light was confirmed.

As a result of an observation using a scanning electron microscope, the surface of the film was found to be considerably flat. An observation of the cross section determined that no columnar structure was observed. The film contained significantly reduced impurities except hydrogen, and no other substance was detected except Xe. The quantity of Xe was in the order of $10^{19}$ $cm^{-3}$.

Although the invention has been described in its preferred form with a certain degree of particularity, it is understood that the present disclosure of the preferred form can be changed in the details of construction and the combination and arrangement of parts may be resorted to without departing from the spirit and the scope of the invention as hereinafter claimed.

What is claimed is:

1. A method of forming a deposited semiconductor film on a substrate comprising the steps of:
   (a) reactively sputtering an amorphous semiconductor film on said substrate employing (i) a target containing semiconductor material to be deposited, (ii) an inert gas containing at least 0.1 atomic % hydrogen, and (iii) a high frequency sputtering discharge of at least 50 MHz;
   (b) irradiating the surface of said amorphous semiconductor film with plasma in an atmosphere containing hydrogen; and
   (c) alternately repeating said steps (a) and (b) by changing target bias voltage; wherein said amorphous semiconductor film contains, as a main component, said semiconductor material and said amorphous semiconductor film is no greater than 10 nm in thickness.

2. The method of claim 1 including applying a DC or high frequency bias voltage to at least one of said target and said substrate.

3. The method of claim 1 including employing a partial pressure of gases other than said inert gas and hydrogen of no greater than $10^{-8}$ Torr.

4. The method of claim 1 including depositing silicon or a silicon alloy as said semiconductor material to be deposited.

* * * * *

UNITED STATES PATENT AND TRADEMARK OFFICE
CERTIFICATE OF CORRECTION

PATENT NO. : 5,500,102  
DATED : March 19, 1996  
INVENTOR(S) : Takeshi Ichikawa et al.

Page 1 of 3

It is certified that error appears in the above-indentified patent and that said Letters Patent is hereby corrected as shown below:

On the title page, item [54],

TITLE

```
"2"
[54] should read --[54]--.
```

REFERENCES CITED

Other Publications, ""Electrical Conduction in evaporated amorphous silicon films," should read --"Electrical Conduction in Evaporated Amorphous Silicon Films,--.

ABSTRACT

Line 5, "0.1 at %" should read --0.1 atomic %--.

COLUMN 2

Line 16, "conference" should read --Conference--.
Line 29, "deposits" should read --deposits,--.

COLUMN 6

Line 38, "object, of" should read --object of--.
Line 55, "be" should be deleted.

UNITED STATES PATENT AND TRADEMARK OFFICE
CERTIFICATE OF CORRECTION

PATENT NO. : 5,500,102

DATED : March 19, 1996

INVENTOR(S) : Takeshi Ichikawa et al.

It is certified that error appears in the above-indentified patent and that said Letters Patent is hereby corrected as shown below:

COLUMN 7

Line 11, "at %" should read --atomic %--.
    Line 64, "0.1 at %" should read --0.1 atomic %--.

COLUMN 8

Line 22, "cheer" should read --chamber--.

COLUMN 14

Line 13, "0.1 at %" should read --0.1 atomic %--.

COLUMN 17

Line 18, "3 at %" should read --3 atomic %--.
    Line 21, "measurement." should read --measurement--.

UNITED STATES PATENT AND TRADEMARK OFFICE
CERTIFICATE OF CORRECTION

PATENT NO. : 5,500,102

DATED : March 19, 1996

INVENTOR(S) : Takeshi Ichikawa et al.

It is certified that error appears in the above-indentified patent and that said Letters Patent is hereby corrected as shown below:

<u>COLUMN 22</u>

```
Line 32, "voltage; wherein" should read
--voltage; ¶ wherein--.
Line 36, "claim 1" should read --claim 1,--.
Line 39, "claim 1" should read --claim 1,--.
Line 42, "claim 1" should read --claim 1,--.
```

Signed and Sealed this

Seventeenth Day of September, 1996

Attest:

BRUCE LEHMAN

*Attesting Officer*       *Commissioner of Patents and Trademarks*